United States Patent [19]

Nagata et al.

[11] 4,015,281
[45] Mar. 29, 1977

[54] MIS-FETS ISOLATED ON COMMON SUBSTRATE

[75] Inventors: Minoru Nagata, Kodaira; Toshiaki Masuhara, Tokorozawa; Masaharu Kubo; Norikazu Hashimoto, both of Hachioji, all of Japan

[73] Assignee: Hitachi, Ltd., Japan

[22] Filed: Mar. 5, 1971

[21] Appl. No.: 121,375

[30] Foreign Application Priority Data

Mar. 30, 1970 Japan .............................. 45-26023
Mar. 30, 1970 Japan .............................. 45-26024

[52] U.S. Cl. ................................. 357/41; 357/23; 357/52
[51] Int. Cl.² ........................................ H01L 27/02
[58] Field of Search ..... 317/235 AZ, 235 G, 235 B

[56] References Cited

UNITED STATES PATENTS

| | | | |
|---|---|---|---|
| 3,456,169 | 7/1969 | Klein ................................. | 317/235 |
| 3,475,234 | 10/1969 | Kerwin ............................... | 148/187 |
| 3,502,950 | 3/1970 | Nigh et al. ......................... | 317/235 |
| 3,550,256 | 12/1970 | Deal .................................... | 29/571 |
| 3,560,810 | 8/1968 | Balk .................................... | 317/235 |
| 3,580,745 | 5/1971 | Kooi et al. .......................... | 148/1.5 |

OTHER PUBLICATIONS

Gregor, I.B.M. Tech Discl. Bull., vol. 11, No. 2, July 1968, pp. 118–119.

*Primary Examiner*—Martin H. Edlow
*Attorney, Agent, or Firm*—Craig & Antonelli

[57] ABSTRACT

An enhancement-type and a depletion-type metal-insulator-semiconductor field effect transistor are formed on a common substrate of silicon and are electrically isolated from each other by a plurality of layers including, for example, a first layer of $SiO_2$, a second layer of $Al_2O_3$ capable of inducing holes in the surface portion of the substrate, and a third layer of $SiO_2$, and the relation between the thicknesses of these layers is suitably selected for attaining the satisfactory isolation between these transistors.

4 Claims, 30 Drawing Figures

MIS-FETS ISOLATED ON COMMON SUBSTRATE

BACKGROUND OF THE INVENTION

1. Field of the Invention

This invention relates to a semiconductor device having a plurality of insulated-gate field effect transistors which are electrically isolated from each other. (The insulated-gate field effect transistor will hereinafter be referred to as MIS-FET as it is generally abbreviated so.) This invention relates further to a semiconductor device having a depletion-type MIS-FET and an enhancement type MIS-FET which are disposed on the surface of a semiconductor substrate in electrically isolated relation from each other.

2. Description of the Prior Art

Electrical isolation between MIS-FET's is an important problem in an MIS-IC and MIS-LSI. MIS-FET's in such MIS-IC or MIS-LSI are electrically shorted to each other through an induced charge layer (called a channel) which exists in the surface portion of the semiconductor substrate between these MIS-FET's and is of the same conduction type as the source and drain regions of the MIS-FET's, or this short-circuit is caused by a parasitic MIS-FET whose gate electrode is the metal interconnection deposited to interconnect the MIS-FET's. Therefore, satisfactory electrical isolation between the MIS-FET's can be attained by preventing the channel from being induced in the substrate surface portion between the FET's and arranging so that the parasitic MIS-FET whose gate electrode is the metal interconnection deposited on the insulator film may not operate. In order to prevent the undesirable operation of the parasitic MIS-FET, the threshold voltage Vth of the parasitic MIS-FET must have a large value which is more than about three times that of the MIS-FET's. The term "threshold voltage Vth" is used herein to designate a gate voltage required for inducing the channel.

An arrangement heretofore employed for the electrical isolation between P-channel MIS-FET's has been such that a thick $SiO_2$ film is used to cover the isolating portion between the P-channel circuit elements for utilizing the electron inducing property of the $SiO_2$ film for preventing electrical shorting between the P-type source and drain regions of one MIS-FET and those of another MIS-FET and the thickness of the $SiO_2$ film is selected to be sufficiently large so as to increase the threshold voltage Vth of the isolating portion for preventing the formation of an undesirable parasitic MIS-FET. However, in the case of N-channel MIS-FET's, the $SiO_2$ film is unfit for use for the electrical isolation between the circuit elements due to the fact that the $SiO_2$ film acts to induce electrons in the surface portion of the semiconductor substrate. It is therefore common practice, in the case of the N-channel MIS-FET's, to attain the electrical isolation between the N-channel circuit elements by applying a negative voltage to the semiconductor substrate thereby to obtain an apparently high threshold voltage Vth. While this method is advantageous in that the MIS-FET's can be easily manufactured because the $SiO_2$ film is solely used as the insulator, it is defective in that a power supply for applying a negative voltage to the substrate is additionally required and the degree of freedom of the circuit is limited due to the fact that the MIS-FET's formed on the substrate are limited to a single type.

Integrated shift register circuits, inverter circuits, logic gate circuits and static memory circuits are frequently used in semiconductor integrated circuits large scale integrations, etc. Such circuits consist basically of a combination of a plurality of unit circuits including a depletion-type and a enhancement-type MIS-FET. The following conditions are essentially required for these circuits: that is (1) at least one enhancement-type MIS-FET should be necessarily included; (2) the MIS-FET's should be completely electrically isolated from each other; and (3) a parasitic MIS-FET should not be formed with, as a gate electrode therefor, connecting leads, such as a power supply lead running on the insulator layer between the first MIS-FET and the second MIS-FET. An MIS-IC can be obtained when the three conditions above described are fully satisfied. The performance of the MIS-IC can be further improved when the following two conditions are satisfied: that is, (4) the MIS-FET used as a load has a low impedance and can make a high speed operation; and (5) the MIS-FET's can operate with a single power supply. Additionally two conditions, that is (6) the MIS-FET's can be manufactured simply by a small number of processing steps; and (7) the threshold voltage can be easily controlled, are important requirements for improving the yield rate of the MIS-IC and reducing the production cost.

In an attempt to meet the above demand, various structures have been proposed for semiconductor devices of the kind having two or more MIS-FET's provided on the surface of a semiconductor substrate and widely used in this field. One example of such semiconductor device has a structure as shown in FIG. 1. Referring to FIG. 1, P-type diffused regions 2, 3, 4, and 5 are formed in the surface portion of an N-type silicon substrate 1 to provide the source and drain regions for two FET's and metal electrode layers 8, 9 and 10 are deposited on $SiO_2$ films 6 and 7 to provide the source, gate and dran electrodes. Thus, this semiconductor device includes two P-channel MIS-FET's. The MIS-FET's shown in FIG. 1 are of the enhancement type since the $SiO_2$ film has generally the property of inducing electrons in the surface portion of the substrate. This semiconductor device satisfies the conditions (1), (2) and (3) among the conditions above described.

Another example has a structure as shown in FIG. 2. Referring to FIG. 2, in which like reference numerals are used to denote like parts appearing in FIG. 1, the insulator interposed between the gate electrode and the semiconductor substrate is in the form of a double-layer film consisting of an $SiO_2$ film 7 and an $Al_2O_3$ film 11. The $Al_2O_3$ film has generally the property of inducing holes in the surface portion of the substrate. Therefore, the thicknesses of the $SiO_2$ film 7 and $Al_2O_3$ film 11 may be suitably controlled so that the $SiO_2$ film predominates over the $Al_2O_3$ film or the $Al_2O_3$ film predominates over the $SiO_2$ film in their influence against the substrate surface thereby selectively inducing electrons or holes in the surface portion of the semiconductor substrate. In the structure shown in FIG. 2, the MIS-FET having a thicker $SiO_2$ film beneath the gate electrode is of the enhancement type, while the MIS-FET having a thinner $SiO_2$ film beneath the gate electrode is of the depletion type The two MIS-FET structures shown in FIGS. 1 and 2 have disadvantages as described below. The MIS structure shown in FIG. 1 has a limited degree of freedom of operation when integrated into a integrated circuit (IC)

because all the MIS-FET's in the IC have the entirely same gate structure. Further, the power dissipation of the semiconductor device is quite great due to the fact that two power supplis are required therefor and a relatively high voltage is used. Moreover, this MIS structure has a high impedance in the off state and its transient response is slow. Thus, this MIS structure does not satisfy the conditions (4) and (5) set forth above.

The MIS structure shown in FIG. 2 is advantageous in that the relative thickness of the two oxide films underlying the gate can be suitably adjusted to provide a high degree of freedom of operation thereby to improve the performance. However, this MIS structure is difficult to practically manufacture because the different thickness of the SiO₂ films underlying the gates of the respective MIS-FET's lead to a complex manufacturing process and the threshold voltage Vth is difficult to control. Further, as seen in FIG. 2, the oxide film underlying the gate of one of the MIS-FET's has a large thickness with the result that the impedance of the MIS-FET is increased and the conductance is decreased. Moreover, this MIS structure is limited to the P-channel type and is not applicable to the N-channel type because electrons are induced in the isolating portion beneath the gate electrode. Thus, this structure does neither satisfy the conditions (2), (3), and (4) nor meet the conditions (6) and (7).

SUMMARY OF THE INVENTION

It is an object of the present invention to provide a semiconductor device in which a novel and improved electrical solution is provided between MIS-FET's, especially N-channel MIS-FET's.

Another object of the present invention is to provide a semiconductor device having an insulating film structure suitable for electrical isolation between N-channel MIS-FET's.

A further object of the present invention is to provide a semiconductor device of novel structure including a depletion-type MIS-FET and an enhancement-type MIS-FET.

Another object of the present invention is to provide a semiconductor device including a depletion-type MIS-FET and an enhancement-type MIS-FET which can be easily manufactured and whose electrical properties can be easily controlled.

In accordance with one aspect of the present invention, there is provided a semiconductor device comprising a P-type semiconductor substrate, at least two N-channel insulated-gate field effect transistors (MIS-FET's) disposed on the surface of said semiconductor substrate in electrically isolated relation from each other, and isolating film means disposed on the surface portion of said semiconductor substrate between said N-channel MIS-FET's and capable of inducing holes at least in the surface portion of said semiconductor substrate whereby to produce an induced hole layer in that surface portion.

In accordance with another aspect of the present invention, there is provided a semiconductor device comprising a p-type semiconductor substrate, at least two N-channel insulating gate field effect transistors (MIS-FET's) disposed on the surface of the semiconductor substrate in electrically isolated relation from each other, and isolating means disposed on the surface of the semiconductor substrate between the N-channel MIS-FET's and formed by a double layer of one insulator capable of inducing holes in the surface portion of the semiconductor substrate and another insulator having a large effective thickness.

In accordance with another aspect of the present invention, there is provided a semiconductor device comprising a P-type semiconductor substrate, at least two N-channel insulated-gate field effect transistors (MIS-FET's) disposed on the surface of said semiconductor substrate in electrically isolated relation from each other, and isolating film means disposed on the surface portion of said semiconductor substrate between said N-channel MIS-FET's and formed by a plurality of films including a first film of insulator stable against various kinds of stress imparted thereto due to high temperature treatment and bias-temperature treatment and deposited directly on the surface portion of said semiconductor substrate, a second film of insulator capable of inducing holes in the surface portion of said semiconductor substrate, and a third film of insulator having a low dielectric constant and a large effective oxide thickness whereby to produce an induced hole layer of controlled impurity concentration in the surface portion of said semiconductor substrate for providing an isolation having a sufficiently high threshold voltage Vth.

The term "effective oxide thickness" is used herein to denote the film thickness as calculated in terms of a single-layer film of SiO₂. The effective oxide thickness $T_{eff}$ of a multiple-layer film such as a double-layer film or triple layer film and so on consisting of an SiO₂ film and films other than the SiO₂ film is approximately given by the following formula:

$$T_{eff} = \left( \frac{T_{SiO_2}}{E_{SiO_2}} + \frac{T_{x1}}{E_{x1}} + \frac{T_{x2}}{E_{x2}} ---- + \frac{T_{xi}}{E_{xi}} +---- \frac{T_{xn}}{E_{xn}} \right) E_{SiO_2}$$

In the above formula, $T_{SiO_2}$ and $E_{SiO_2}$ are the thickness and dielectric constant (3.8) respectively of the SiO₂ film, and $T_{xi}$ and $E_{xi}$ ($i = 1, 2, i, n$) are the thickness and dielectric constant respectively of a film other than the SiO₂ film, for example, an Al₂O₃ film.

In accordance with a further aspect of the present invention, there is provided a semiconductor device of the kind described above comprising isolating film means of triple-layer structure in which an SiO₂ film or SiO₂ — P₂O₅ . SiO₂ film, an Al₂O₃ film and an SiO₂ film are successively stacked to form the first, second and third layers, respectively. In order that the semiconductor device has stable electrical properties, the isolating film portion has a sufficiently small capacitance and the threshold voltage of a parasitic MIS-FET is more than three times the threshold voltage |Vth| (absolute value) of the N-channel MIS-FET's, it is proposed herein that the first layer should have a thickness less than 2,000 A, preferably in the range of 100 t 1,000 A, the second layer should have a thickness which is one-half to five times that of the first layer, and the third layer should have a thickness which is more than two times the effective oxide thickness of the composite film of the first and second layers calculated in terms of a single-layer film of $SiO_2$. When the thickness of the first layer is larger than 2,000 A, the second layer cannot induce holes sufficiently in the surface portion of the semiconductor substrate. While better electrical properties can be obtained with a smaller thickness of the first layer, a thickness of 100 A is a limit of obtaining $SiO_2$ films with a good yield rate according to the present manufacturing technique. With a thickness less than 100 A, pin holes are liable to occur in $SiO_2$ films and a poor yield rate results. According to the experience of the inventors, the thickness of the first layer $SiO_2$ film or a composite $SiO_2 - P_2O_5 . SiO_2$ film lies desirably in the range of 100 to 1,000 A. An $SiO_2$ film showing good properties in spite of a thickness than than 100 A will appear in the future with the progress in the manufacturing technique.

In accordance with another aspect of the present invention, there is provided a semiconductor device comprising a semiconductor substrate, at least a first insulated-gate field effect transistor (MIS-FET) and a second insulated-gate field effect transistor (MIS-FET) disposed on the surface of said semiconductor substrate in electrically isolated relation from each other, gate insulating film means (or gate insulator) disposed directly beneath the gate electrode of said first MIS-FET on the channel portion and including a film capable of inducing electrons in the surface portion of said semiconductor substrate, another gate insulating means (or gate insulator) disposed directly beneath the gate electrode of said second MIS-FET on the channel portion and including a film capable of inducing holes in the surface portion of said semiconductor substrate, and isolating means disposed on the surface of said semiconductor substrate between said first and second MIS-FET's and including a film capable of inducing holes in the surface portion of said semiconductor substrate.

In accordance with still another aspect of the present invention, there is provided a semiconductor device of the kind above described, in which said first gate insulating means disposed beneath the gate electrode of said first MIS-FET includes a film of $SiO_2$ or a double-layer film consisting of a layer of $SiO_2$ and a layer of phosphosilicate glass, and said second gate insulating means disposed beneath the gate electrode of said second MIS-FET includes a film of $SiO_2$ or a double-layer film consisting of a layer of $SiO_2$ and a layer of phosphosilicate glass and a film of insulator capable of inducing holes such as $Al_2O_3$ or silicon oxide deposited by the thermal decompositon of tetraethoxy silane. Further, the present invention proposes, in such a semiconductor device, the relation between the film thicknesses of these gate insulators and the film thickness of the isolating means used for electrically isolating the MIS-FET's from each other.

In accordance with a further aspect of the present invention, there is provided a semiconductor device of the kind above described, in which said first gate insulator for said first MIS-FET is in the form of a film selected from the group consisting of a film of $SiO_2$ and a double-layer film of $SiO_2$ and phosphosilicate glass and having a thickness less than 2,000 A, preferably from 100 to 1,000 A, while said second gate insulator for said second MIS-FET is in the form of a composite film including a film selected from the group consisting of a film of $SiO_2$ and a double-layer film of $SiO_2$ and phosphosilicate glass and having a thickness less than 2,000 A, preferably from 100 to 1,000 A, and a film selected from the group consisting of a film of $Al_2O_3$ and a film of silicon oxide deposited by the thermal decomposition of tetraethoxy silane and having a thickness which is one-half to five times that of said $SiO_2$ or $SiO_2 - P_2O_5 . SiO_2$ film, and said isolating means used for electrically isolating said MIS-FET's from each other is in the form of a composite film including a film selected from the group consisting of a film of $SiO_2$ and a double-layer film of $SiO_2$ and phosphosilicate glass and a film selected from the group consisting of a film of $Al_2O_3$ and a film of silicon oxide deposited by the thermal decomposition of tetraethoxy silane, and isolating means having an effective oxide thickness which is more than two times the effective oxide thickness of said second gate insulator.

Films preferably used in the present invention for inducing electrons in the surface portion of a semiconductor substrate include a single-layer film of $SiO_2$ or $Si_3N_4$, a double-layer film of $SiO_2$ and $P_2O_5 . SiO_2$ (phosphosilicate glass), a double-layer film of $SiO_2$ and $B_2O_5 . SiO_2$ (boroslicate glass, a double-layer film of $SiO_2$ and $PbO . SiO_2$ (lead glass), a double-layer film of $SiO_2$ and $Si_3N_4$, and a triple-layer film in which one of these double-layer films is covered with an $SiO_2$ film.

The thickness of the above film is desirably less than about 2,000 A from the view point of ease with which the threshold voltage Vth of the MIS-FET and the signal applied to the gate electrode can be controlled. A film thickness of the order of 100 to 1,000 A is especially preferable in order than the MIS-FET has satisfactory electrical properties and the film is free from a defect such as pin holes. However, the film thickness is in no way limited to the above range, and a film thickness of, for example, more than 1,000 A may be employed in the present invention. In this latter case, however, the electrical properties are degraded to some extent. An isolating film whose thickness is less than 100 A is also employable if it has a suitable dielectric constant and is free from pin holes.

Films preferably used in the present invention for inducing holes in the surface portion of a semiconductor substrate include an $Al_2O_3$ film, a silicon oxide film produced by the thermal decomposition of tetraethoxy silane, a film of oxides of elements such as Ti, Ni, Zr, Ta, Th, V, Fe, Zn and Cu, a double-layer film of $SiO_2$ and $Al_2O_3$, a double-layer film of $SiO_2$ and silicon oxide produced by the thermal decomposition of tetraethoxy silane, a triple-layer film of $SiO_2$, $P_2O_5 \cdot SiO_2$ (phosphosilicate glass) and $Al_2O_3$, a triple-layer film of $SiO_2$, $Al_2O_3$ and $SiO_2$, and a triple-layer film of $SiO_2$, $P_2O_5 \cdot SiO_2$ (phosphosilicate glass) and silicon oxide produced by the thermal decomposition of tetraethoxy silane.

An $SiO_2$ film acts to induce electrons in the surface portion of a semiconductor substrate as described previously, but when this $SiO_2$ film is combined with an $Al_2O_3$ film or a silicon oxide film produced by the thermal decomposition of tetraethoxy silane to form a double-layer film and the ratio of the thickness of the former to the thickness of the latter is selected suitably, the composite film acts to induce holes in the surface portion of the semiconductor substrate.

The double-layer or triple-layer film is preferably used for the reasons that the thicknesses of the component films may be suitably controlled to cancel the holes existing in the surface portion of a semiconductor substrate so as to thereby easily control the gate voltage or threshold voltage required for inducing electrons in such portion.

In the present invention, the isolating film may be formed by any suitable method known in the art. For example, the SiO₂ film may be formed by heating a semiconductor substrate of silicon to a high temperature in an atmosphere of steam or dry oxygen for oxidizing the substrate surface, or by the thermal decomposition of organic silicon compounds, sputtering or glow discharge. The Al₂O₃ film may be formed by evaporating aluminum on a semiconductor substrate and then heating it in an oxidizing atmosphere, or by the thermal decomposition of organic compounds of aluminum, or by causing glow discharge in an atmosphere of a mixture of vapor of aluminum halides and oxygen. Known methods may be suitably applied for the formation of other films.

As for the semiconductor preferably used in the present invention, silicon is generally referred to in the specification, but it is apparent that other known semiconductors such as germanium, GaAs, InSb, GaAs$_{1-x}$Ps, and InP are also included in the scope of the present invention.

The present invention provides many advantages as described below. A first advantage resides in the fact that electrical isolation between MIS-FET's can be easily realized. A priorly proposed method for providing an isolation in a semiconductor device of this kind comprised diffusing a P-type impurity to form a high-doped layer between FET's thereby electrically cutting off the channel, but this method is not employed at present due to the fact that the additional step of diffusion is required. According to the present invention, the electrical isolation is provided by a plurality of insulator layers deposited on the surface of a semiconductor substrate between FET's so that the step of impurity diffusion for this purpose is unnecessary and any substantial area for the diffusion is not required. Thus, the FET's can be provided in close proximity to each other and a high packing density can be obtained.

According to the present invention, the isolating film means used for the purpose of electrical isolation is in the form of a composite film structure consisting of three or more layers of films including a first film of insulator which is deposited directly on the surface of a semiconductor substrate and is stable against various kinds of stress due to high temperature treatment and bias-temperature treatment, a second film of insulator acting to induce holes in the surface portion of the substrate, and a third film of insulator having a low dielectric constant and a large effective oxide thickness. This composite film structure provides a second advantage. More precisely, (1) the threshold voltage Vth at the isolating portion is stable against various kinds of stress; (2) a composite film is better than a single-layer film for obtaining the desired stability of the electrical properties of MIS-FET's of the N-channel enhancement mode produced on the same semiconductor substrate in that a required threshold voltage Vth can be obtained and the film is stable against various kinds of stress; and (3) the capacitance of the isolating film is desirably as low as possible and the use of a composite film in which one or more of component films have a low dielectric constant is preferable in that a predetermined threshold voltage Vth and a small capacitance can be obtained without increasing the overall thickness of the composite film. A composite isolating film of triple-layer structure consisting of an SiO₂ film (electron-inducing film) of a predetermined thickness formed on the surface of a silicon substrate by the thermal decomposition of an organic silicon compound, an Al₂O₃ film deposited on the SiO₂ film, and an SiO₂ film deposited on the Al₂O₃ film, is especially useful in that the concentration of holes can be accurately controlled by suitably selecting the ratio of the thickness of the first SiO₂ film to the thickness of the Al₂O₃ film. The second SiO₂ film deposited on the Al₂O₃ film does not substantially participate in the control of the hole concentration but rather acts to reduce the capacitance of the composite isolating film and increase the threshold voltage Vth. It is proved that the application of bias-temperature treatment to an MIS-FET structure having a triple-layer isolating film as above described is effective to reduce the value of $\Delta N_{AB}$.

A third advantage of the present invention resides in the fact that an N-channel MIS-FET can be obtained easily. Since the N-channel MIS-FET has a high switching speed four to eight times that of a P-channel MIS-FET, a high-speed integrated circuit or an integrated circuit of high packing density can be thereby realized.

A fourth advantage of the present invention resides in the fact that a depletion-type MIS-FET and an enhancement-type MIS-FET can be formed in an isolated relationship on the surface of a semiconductor substrate, thereby further increasing the switching speed to about eight to sixteen times that of the P-channel MIS-FET.

A fifth advantage of the present invention resides in the fact that a depletion type MIS-FET and an enhancement-type MIS-FET having respective optimum threshold voltages can be manufactured while eliminating the formation of an undesirable parasitic MIS-FET. That is, the isolating portion between these MIS-FET's has a high threshold voltage and the MIS-FET's can be produced without increasing the number of steps for the manufacture. This is attained by arranging in such a manner that the insulating film in contact with the semiconductor substrate beneath the MIS-FET portions consists of a single-layer film of SiO₂ or a double-layer film of SiO₂ and phosphosilicate glass and has a thickness less than 2,000 A, preferably in the range of 100 to 1,000 A.

A sixth advantage is associated with the fourth and fifth advantages. That is, by virtue of the fourth and fifth advantages above described, the MIS-FET acting as a load can be always operated in the normally on condition and a single power supply is solely required, which leads to a reduction in the area required for electrical wiring for power supply.

A seventh advantage resides in the fact that the semiconductor device of the present invention having a structure as above described can be relatively easily manufactured.

An eighth advantage resides in the fact that a first MIS-FET having a gate insulating means in the form of a single-layer film of SiO₂ or a double-layer film of SiO₂ and phosphosilicate glass and a second MIS-FET having a gate insulating means in the form of a composite film obtained by depositing an Al₂O₃ film or silicon oxide film (produced by the thermal decomposition of tetraethoxy silane) on the said insulating film, can be easily formed on a semiconductor substrate without increasing the number of manufacturing steps. In addition, due to the fact the SiO₂ film which is stable against various kinds of stress due to high temperature treatment or bias-temperature treatment is in contact with the semiconductor substrate, these MIS-FET's are free from any variation in the threshold voltage and can therefore operate stably.

DESCRIPTION OF THE PREFERRED EMBODIMENTS

EMBODIMENT 1

Figure 1:
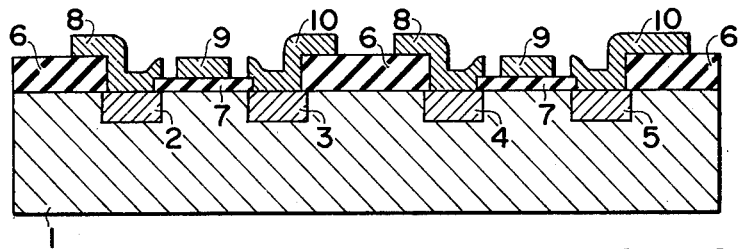
FIGS. 1 and 2 are schematic vertical sectional views of known insulated-gate field effect transistors.
Figure 2:
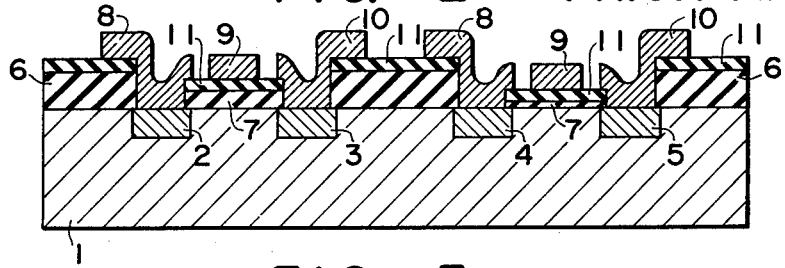
Figure 3:
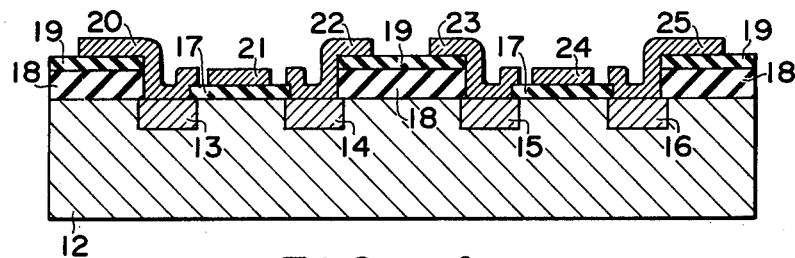
FIG. 3 is a partly enlarged, schematic vertical sectional view of an embodiment of the present invention.

FIG. 3 shows one of the basic embodiments of the present invention in which it will be seen that two N-channel MIS-FET's are formed on the surface of a semiconductor substrate in electrically isolated relation from each other. Referring to FIG. 3, N-type regions 13, 14, 15 and 16 are formed in one of the principal surfaces of a P-type silicon substrate 12 by the selective diffusion of an N-type impurity. These regions serve as the source and drain regions of the MIS-FET's. A so-called gate insulator 17 for the MIS-FET's is formed from $SiO_2$. This $SiO_2$ layer 17 may be deposited by any suitable method known in the art. Generally, this $SiO_2$ layer 17 is deposited by heating the surface of the silicon substrate 12 in an oxidizing atmosphere or by the channel vapor deposition method commonly called the CVD method. An $Al_2O_3$ layer 18 is also deposited on the surface of the silicon substrate 12 and has a thickness larger than that of the gate insulator 17. An $SiO_2$ layer 19 covers the $Al_2O_3$ layer 18. This $SiO_2$ layer 19 is the portion of a mask employed for the selective etching of the $Al_2O_3$ layer 18 and may be removed if unnecessary. However, the presence of the $SiO_2$ layer 19 is desirable in that it contributes to the reduction of a stray capacitance that may be formed between metal conductors (not shown) and the semiconductor substrate 12. Source electrodes 20 and 23 are connected to the source regions 13 and 15, respectively. Gate electrodes 21 and 24 are deposited on the gate insulator 17. Drain electrodes 22 and 25 are connected to the drain regions 14 and 16, respectively.

It will thus be seen that a first MIS-FET having the source electrode 20, gte electrode 21 and drain electrode 22, and a second MIS-FET having the source electrode 23, gate electrode 24 and drain electrode 25 are formed on the P-type silicon substrate 12 in completely electrically isolated relation from each other. More precisely, due to the fact that the $Al_2O_3$ layer 18 is directly deposited on the surface of the semiconductor substrate 12 between the first and second MIS-FET's, the $Al_2O_3$ layer 18 acts to induce holes in that surface portion of the substrate 12 and this induced hole layer acts to electrically isolate the source or drain region of the first MIS-FET from the source or drain region of the second MIS-FET. Both the first and second MIS-FET's shown in FIG. 3 are of the depletion type.

EMBODIMENT 2

FIGS. 4 to 9 illustrate successive steps for forming a depletion-type N-channel MIS-FET and an enhancement-type N-channel MIS-FET on the surface of a P-type silicon substrate, and at the same time, forming an isolating means between these two MIS-FET's for electrically isolating them from each other. In FIGS. 4 to 9, parts are shown in an enlarged scale for the convenience of explanation.

Figure 4:
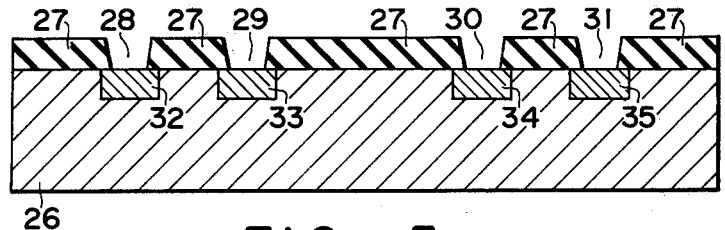
FIGS. 4 to 9 are partly enlarged, schematic vertical sectional views showing successive steps for the manufacture of another embodiment of the present invention.

Referring to FIG. 4, a layer 27 of $SiO_2$ about 0.5 $\mu$ thick is formed on the surface of a P-type silicon substrate 26 having a resistivity of 5 $\Omega$-cm by the thermal oxidization of the substrate surface. Openings 28, 29, 30 and 31 are bored in the $SiO_2$ layer 27 by means of photo-etching at portions corresponding to source and drain regions of MIS-FET's, and an N-type impurity is diffused under heat into the substrate 26 to form N-type source regions 32 and 34 and N-type drain regions 33 and 35.

Figure 5:
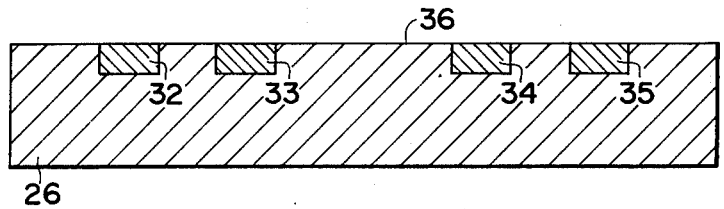
Figure 6:
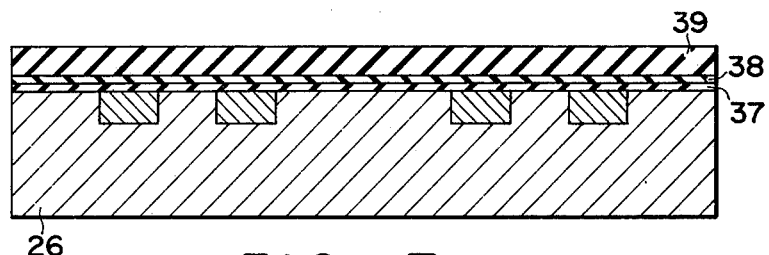

The above structure is then subject to etching to completely remove the $SiO_2$ layer 27 existing on the surface of the silicon substrate 26 as shown in FIG. 5. Subsequently, the substrate surface is thermally oxidized to form an $SiO_2$ layer 37 about 500 A thick on the substrate surface as shown in FIG. 6. An $Al_2O_3$ layer 38 about 2,000 A thick is then deposited on the $SiO_2$ layer 37 by the chemical vapor deposition method (CVD method). In the step of deposition of the $Al_2O_3$ layer 38, the substrate 26 is heated to a temperature of 800° to 900° C. in an atmosphere including $AlCl_3$, $H_2$ and $CO_2$. After the deposition of the $Al_2O_3$ layer 38, an $SiO_2$ layer 39 about 5,000 A thick is deposited on the $Al_2O_3$ layer 38. The $SiO_2$ layer 39 may be deposited by any suitable known methods including thermal decomposition of organic silicon compounds and sputtering.

Figure 7:
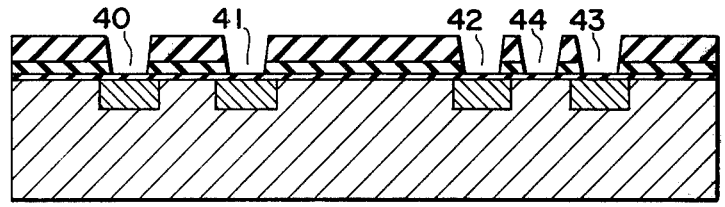
Figure 8:
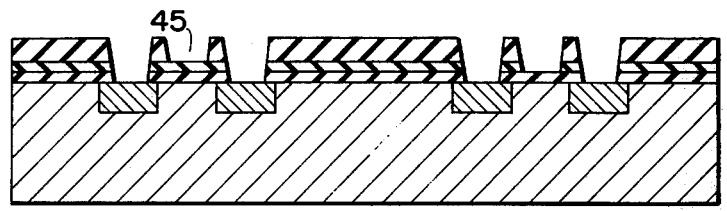
Figure 9:
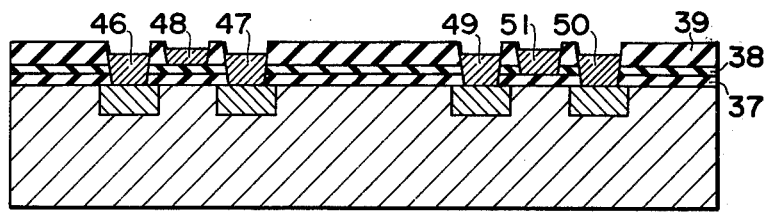

Photo-etching is then applied to the composite film consisting of three layers as shown in FIG. 6 so as to remove the film portions corresponding to source, drain and gate electrodes of FET's. In the step of photo-etching, openings 40, 41, 42, 43 and 44 are bored at first in the composite film as shown in FIG. 7. Then, an opening 45 is bored in the $SiO_2$ layer 39, and at the same time, the source and drain regions are exposed as shown in FIG. 8. The $SiO_2$ layers 39 and 37 are etched by a 1 : 6 mixture of HF and $NH_4F$, while the $Al_2O_3$ layer 38 deposited at the temperature of 800° to 900° C. is etched by hot $H_3PO_4$ at 100° to 170° C. While a photo-resist film is used as a mask for the etching of the $SiO_2$ layer 39 having been etched to have the desired openings therein is used as a mask for the etching of the $Al_2O_3$ layer 38. After the predetermined openings have been bored in the composite film, aluminum is evaporated to provide source electrodes 46 and 49, drain electrodes 47 and 50, and gate electrodes 48 and 51 as shown in FIG 9.

By the above steps, an enhancement-type N-channel MIS-FET having the source electrode 46, drain electrode 47 and gate electrode 48, and a depletion-type N-channel MIS-FET having the source electrode 49, drain electrode 50 and gate electrode 51 are formed on the surface of the P-type silicon substrate 26 and are completely electrically isolated from each other by the composite isolating film. The isolating portion of the MIS-IC manufactured by the above process had a threshold voltage Vth higher than 15 volts, and when a power supply line of 5 volts was connected thereto, no parasitic MIS-FET was formed. Further, when a semiconductor device having a structure as shown in FIG. 9 was used to make an inverter circuit, it could operate with a high-speed switching time in which the delay time per stage was only about 7 ns. This switching time is about ten times as fast as that of conventional inverter circuits utilizing a P-channel MIS-IC.

Figure 10:
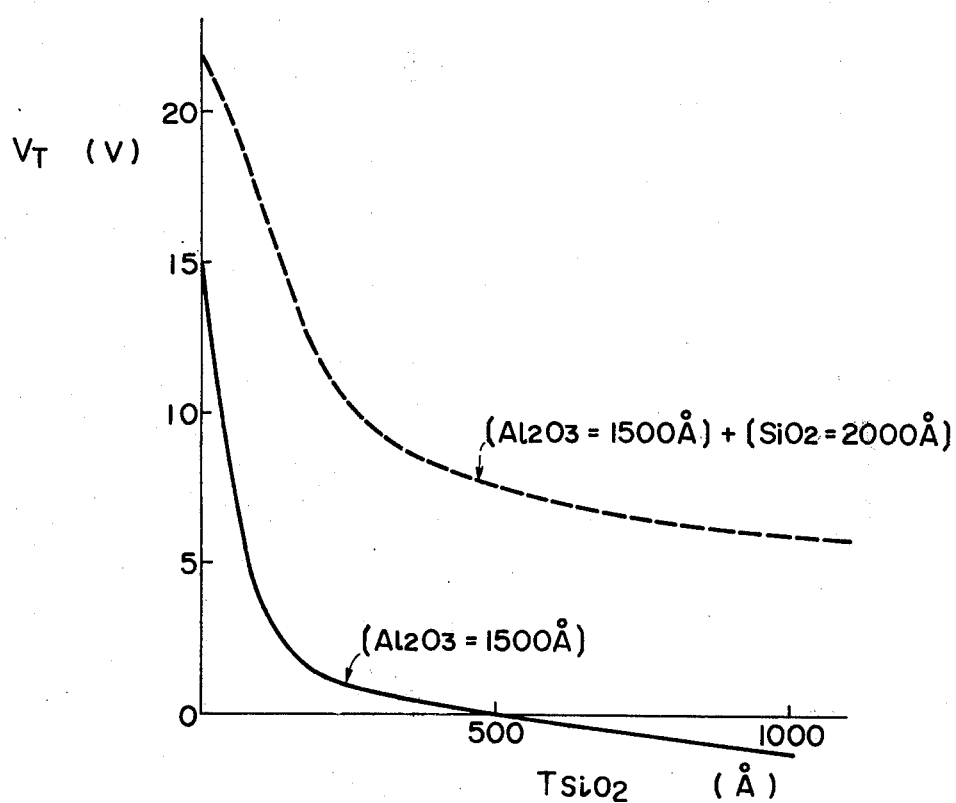
FIG. 10 is a graph illustrating the merits of the present invention in which the vertical and horizontal axes represent the threshold voltage and the thickness of the isolating film respectively to show the relation therebetween.

A test was carried out to find the actual value of the threshold voltage Vth of the isolating portion which is in the form of a composite film consisting of layers of $SiO_2$, $Al_2O_3$ and $SiO_2$ as above described. The test results are shown in FIG. 10, in which the horizontal axis represents the thickness of the first $SiO_2$ layer 37 shown in FIG. 9 and the vertical axis represents the threshold voltage. The threshold voltage of a film structure consisting of the $SiO_2$ layer and an overlying $Al_2O_3$ layer 1,500 A thick was compared with the threshold voltage of a film structure consisting of the above film structure plus an overlying $SiO_2$ layer 2,000 A thick as that shown by 39 in FIG. 9. From FIG. 10, it will be seen that the threshold voltage Vth of the latter is by about 8 volts higher than that of the former.

The threshold voltage Vth varies by about −20 and −0.5 volt for the respective thicknesses of the first $SiO_2$ layer of 500 A and 700 A when the composite film is subject to bias-temperature treatment at 300° C. at +10 volts. However, when phosphosilicate glass ($P_2O_5/SiO_2$ = 1/10) is used in the third layer of $SiO_2$, the threshold voltage Vth varies in a narrow range of about ±0.5° volt for bias-temperature treatment at 300° C. at ±10 volts. Thus, the use of phosphosilicate glass in the third layer is desirable for obtaining improved stability against the bias-temperature treatment.

EMBODIMENT 3

FIGS. 11 to 19 show successive steps for simultaneously forming a depletion-type N-channel MIS-FET and an enhancement N-channel MIS-FET on the surface of a P-type silicon substrate. In FIGS. 11 to 19, parts are shown in an enlarged scale for the convenience of explanation.

Figure 11:
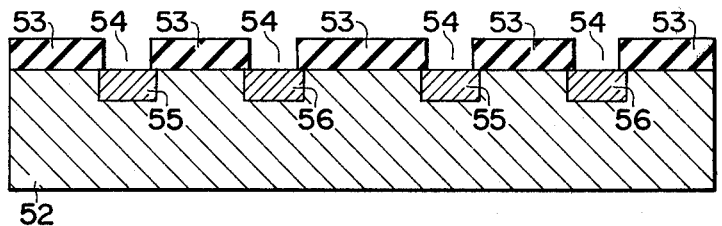
FIGS. 11 to 19 are partly enlarged, schematic vertical sectional views showing successive steps for the manufacture of a further embodiment of the present invention.
Figure 12:
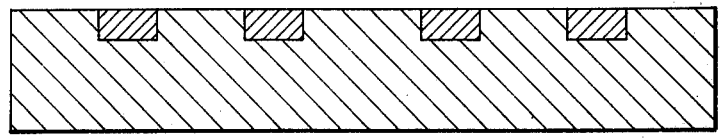

Referring to FIG. 11, an $SiO_2$ layer 53 is formed on the surface of a P-type silicon substrate 52 by the thermal oxidization of such surface. Photo-etching is applied to this $SiO_2$ layer 53 to remove portions of the $SiO_2$ layer 53 corresponding to source and drain regions of MIS-FET's to be formed, thereby providing openings 54 in the $SiO_2$ layer 53 and partly exposing the surface of the silicon substrate 52. The exposed portions of the substrate surface are doped under heat with an N-type impurity such as, for example, phosphorus to form N-type diffused regions 55 and 56 serving as the source and drain regions, respectively. After the formation of the diffused regions, the $SiO_2$ layer 53 having been used as the mask is completely removed from the surface of the semiconductor substrate 52 thereby exposing the entire surface of the substrate 52 as shown in FIG. 12.

Figure 13:
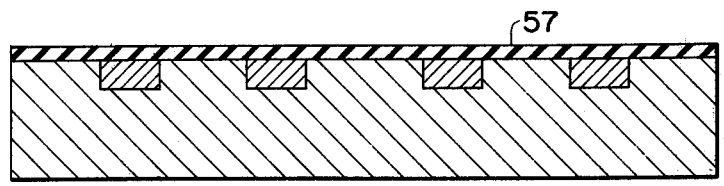
Figure 14:
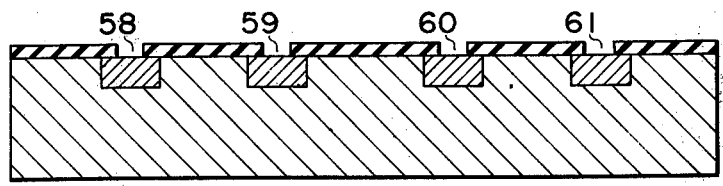
Figure 15:
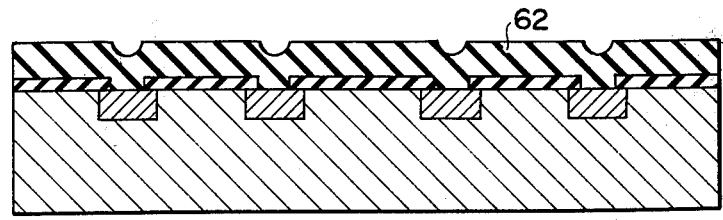
Figure 16:
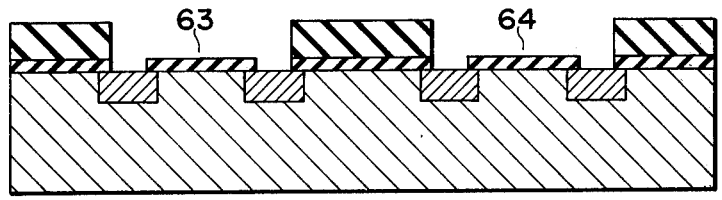

Then, the surface of the silicon substrate 52 is subject to thermal oxidization again to form a fresh $SiO_2$ layer 57 about 500 A thick thereon as shown in FIG. 13. Photo-etching is then applied to the $SiO_2$ layer 57 so as to bore openings 58, 59, 60 and 61 for partly exposing the source and drain regions 55 and 56 as shown in FIG. 14. An organic compound of aluminum is thermally decomposed to deposit an $Al_2O_3$ layer 62 about 7,000 A thick on the $SiO_2$ layer 57 as shown in FIG. 15. After the deposition of the $Al_2O_3$ layer 62, parts of the $Al_2O_3$ layer 62 corresponding to gate, source and drain electrode portions of MIS-FET's are removed to provide openings 63 and 64 in the $Al_2O_3$ layer 62 as shown in FIG. 16. A 20 : 15 : 150 mixture of 50% by weight HF, 60% by weight $HNO_3$ and water is used for the selective etching of the $Al_2O_3$ layer 62.

Figure 17:
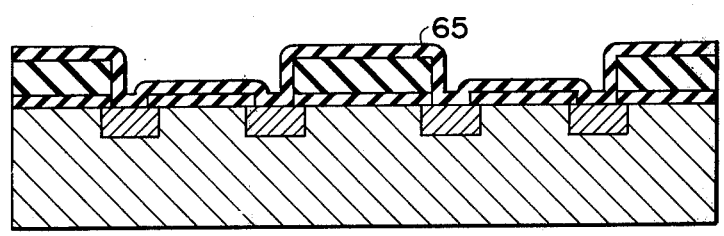
Figure 18:
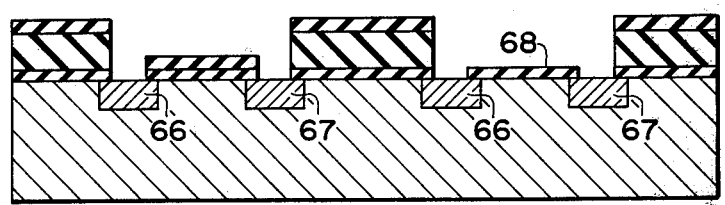
Figure 19:
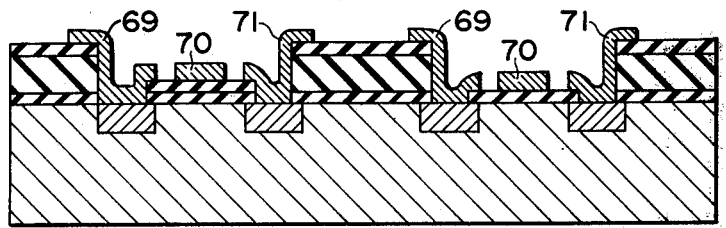

Thereafter, an $Al_2O_3$ layer 65 about 2,000 A thick is deposited on the substrate surface again by the thermal decomposition of an organic compound of aluminum as shown in FIG. 17. After the deposition of the $Al_2O_3$ layer 65, photo-etching is applied to remove parts of the newly deposited $Al_2O_3$ layer 65 corresponding to source and drain electrode portions 66 and 67 and a gate electrode portion 68 of one of the MIS-FET's as shown in FIG. 18. An electrode metal such as aluminum is then evaporated on the substrate surface, and parts of the deposited aluminum layer are suitably etched away to provide source, drain and gate electrodes 69, 70 and 71 of the MIS-FET's as shown in FIG. 19.

By the above steps, an enhancement-type N-channel MIS-FET and a depletion-type N-channel MIS-FET can be formed on the surface of the P-type silicon substrate. Referring to FIG. 19, one of the MIS-FET's which includes solely the $SiO_2$ layer 57 in the gate insulator is the depletion-type MIS-FET (or MOS-FET in this case), while the other MIS-FET which includes the $SiO_2$ layer 57 and the $Al_2O_3$ layer 65 in the gate insulator is the enhancement-type MIS-FET since, in the latter, the $Al_2O_3$ layer 65 acts to induce holes in the surface portion of the silicon substrate between the source and drain regions. In the semiconductor device, the isolating film structure disposed between the two MIS-FET's consists of the thin $SiO_2$ layer 57 and the overlying thick $Al_2O_3$ layers 62 and 65, and thus holes are induced in the surface portion of the silicon substrate between these two MIS-FET's thereby electrically isolating the MIS-FET's from each other.

In the semiconductor device manufactured by the above process, the threshold voltage Vth of the depletion-type MIS-FET was about -2 to -3 volts, while the threshold voltage Vth of the enhancement-type MIS-FET was about 0.5 to 1.0 volt. When an inverter circuit was constituted by these two kinds of MIS-FET elements and was operated at 5 volts with a capacitance of 1 pF at the output node, it could operate at a high switching speed with a delay time of less than 10 ns. The delay time of conventional inverter circuits utilizing a P-channel MOS-IC is of the order of 100 ns. Thus, the present invention could attain a switching speed about ten times as fast as that of conventional inverters. Further, the threshold voltage of a parasitic MIS-FET formed between the two MIS-FET's was of the order of 10 volts and thus complete electrical isolation could be attained.

EMBODIMENT 4

This embodiment is intended to provide a semiconductor device in which a layer capable of inducing holes is directly deposited on the surface of a semiconductor substrate at a position corresponding to the isolating portion and a layer capable of inducing electrons and having a low dielectric constant E, such as an $SiO_2$ layer, a phosphosilate glass ($P_2O_5 \cdot SiO_2$) layer, or a composite layer of an $SiO_2$ layer and a $P_2O_5 \cdot SiO_2$ layer is deposited on the first layer so as to increase the threshold voltage Vth of a parasitic MIS-FET and reduce the MIS capacitance.

FIGS. 20 to 25 show successive steps for the manufacture of such a semiconductor device, and parts are shown in an enlarged scale for the convenience of explanation.

Figure 20:
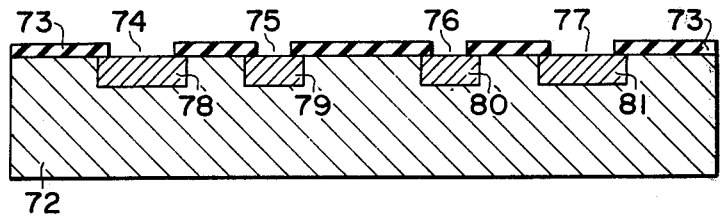
FIGS. 20 to 25 are partly enlarged, schematic vertical sectional views showing successive steps for the manufacture of a yet further embodiment of the present invention.

Referring to FIG. 20, an $SiO_2$ layer 73 about 500 A thick is formed on the surface of a P-type silicon substrate 72 having a resistivity of 5 $\Omega$–cm by means of thermal oxidization of such surface. Photo-etching is applied to the $SiO_2$ layer 73 to bore openings 74, 75, 76 and 77 therein at portions corresponding to source and drain regions of MIS-FET's to be formed, thereby exposing parts of the surface of the silicon substrate 72. An N-type impurity such as phosphorus is diffused under heat through these openings 74 to 77 to form N-type diffused regions 78, 79, 80 and 81 in the surface portion of the silicon substrate 72. The diffused regions 78 and 81 serve as the source regions of the MIS-FET's, while the diffused regions 79 and 80 serve as the drain regions thereof.

Figure 21:
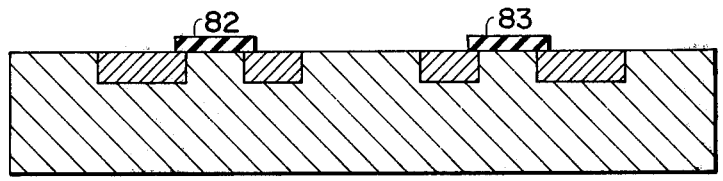
Figure 22:
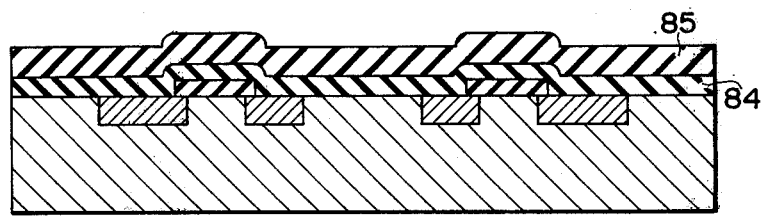
Figure 23:
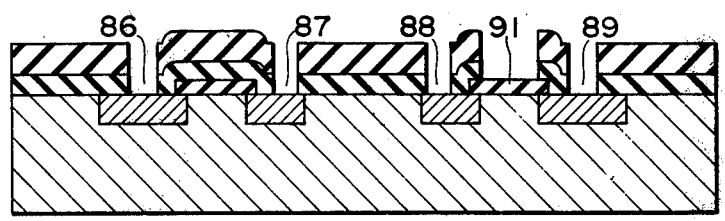
Figure 24:
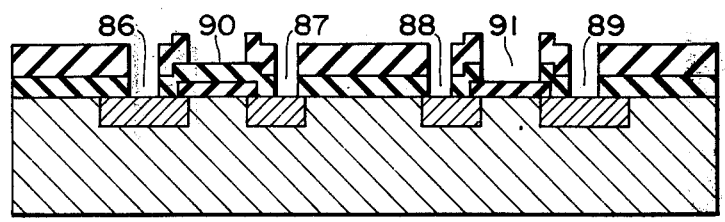

Photo-etching is applied to the $SiO_2$ layer 73 to remove the $SiO_2$ layer 73 from the substrate surface except portions 82 and 83 thereby exposing the remaining portions of the surface of the silicon substrate 72 as shown in FIG. 21. Then, an $Al_2O_3$ layer 84 about 2,000 A thick is deposited on the substrate surface by the thermal decomposition of an organic compound of aluminum, and an $SiO_2$ layer 85 about 5,000 A thick is deposited on the $Al_2O_3$ layer 84 by the thermal decomposition of monosilane as shown in FIG. 22. Subsequently, as shown in FIG. 23, openings 86, 89 and 87, 88 are bored through the $SiO_2$ layer 85 and the $Al_2O_3$ layer 84 for the later deposition of the source and drain electrodes, respectively, of the MIS-FET's. Another opening 91 is bored through the $SiO_2$ layer 85 and the $Al_2O_3$ layer 84 for the later deposition of the gate electrode of one of the MIS-FET's. An etching solution consisting essentially of HF is used for the etching of the $SiO_2$ layer 85, while hot $H_3PO_4$ is used for the etching of the $Al_2O_3$ layer 84. The etching solution for the $SiO_2$ layer does not etch the $Al_2O_3$ layer, while hot $H_3PO_4$ does not etch the $SiO_2$ layer. Then another opening 90 is bored in the $SiO_2$ layer 85 as shown in FIG. 24 for the later deposition of the gate electrode of the other MIS-FET. A layer of an electrode metal such as aluminum about 6,000 A thick is deposited on the substrate surface and photo-etching is applied to the aluminum layer to provide the source electrodes 92 and 95, drain electrodes 93 and 94, and gate electrodes 96 and 97 of the MIS-FET's as shown in FIG. 25.

Figure 25:
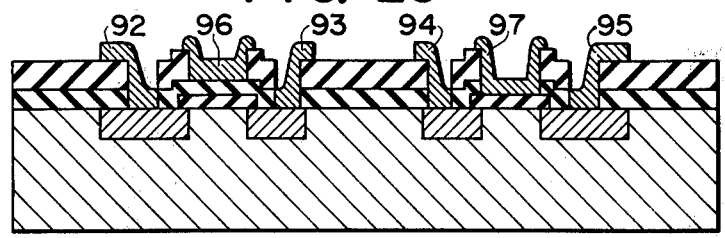

It will be seen in FIG. 25 that an enhancement-type N-channel MIS-FET having the source, drain and gate electrodes 92, 93 and 96, and a depletion-type N-channel MIS-FET having the source, drain and gate electrodes 95, 94 and 97 are formed on the surface of the P-type silicon substrate, and these two MIS-FET's are completely electrically isolated from each other by the composite film structure consisting of the $Al_2O_3$ layer and the $SiO_2$ layer deposited on the surface of the silicon substrate between these two MIS-FET's. The threshold voltage Vth of this isolating portion was measured, and this threshold voltage Vth was in the range of +30 to +40 volts.

The composite film structure forming the isolating portion in the present embodiment is such that an $Al_2O_3$ layer is first deposited on the surface of the silicon substrate and then an $SiO_2$ layer is deposited on the $Al_2O_3$ layer. This structure is advantageous over a composite film structure in which these layers are deposited in the reverse order in that the same effect can be obtained with a thinner total thickness of the composite film. A semiconductor device having a structure as above described was used as an inverter circuit and was operated with a capacitance of 1 pF at the output node. This inverter circuit could operate at a high switching speed with a delay time of less than 10 ns.

EMBODIMENT 5

FIGS. 26 to 30 show successive steps for the manufacture of a semiconductor device in which an $SiO_2$ layer deposited on the surface of a semiconductor substrate by the thermal decomposition of tetraethoxy silane is used as a means for inducing holes in the surface portion of the semiconductor substrate.

Figure 26:
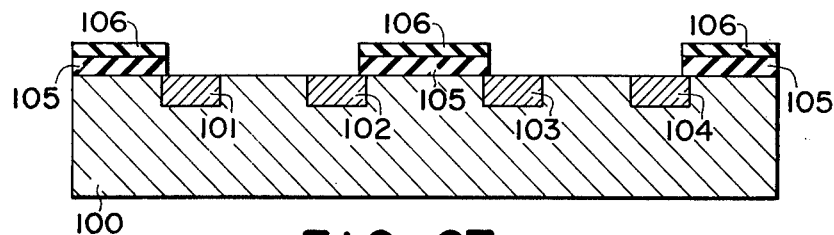
FIGS. 26 to 30 are partly enlarged, schematic vertical sectional views showing successive steps for the manufacture of a still further embodiment of the present invention.

Referring to FIG. 26, a P-type silicon substrate 100 has a resistivity of 10$\Omega$–cm and its principal surfaces lie in the (100) plane. An $SiO_2$ layer about 6,000 A thick is formed on one of the surfaces of the silicon substrate 100 by the thermal oxidization of such surface, and then openings are bored through the $SiO_2$ layer. An N-type impurity is diffused into the substrate 100 through the openings to form N-type diffused regions 101, 102, 103 and 104 in the substrate 100. The $SiO_2$ layer used as a mask for the impurity diffusion is completely removed, and then the silicon substrate 100 is placed in a reaction tube connected to a vacuum means. Then, while evacuating the reaction tube and heating the silicon substrate 100° to about 780° C., vapor of tetraethoxy silane $Si(C_2H_5O)_4$ is introduced into the reaction tube. By this treatment, the tetraethoxy silane vapor is thermally decomposed in the vicinity of the surface of the silicon substrate 100 so that an $SiO_2$ layer 105 is deposited on the substrate surface. After the $SiO_2$ layer 105 attains a thickness of about 7,000 A, $P_2O_5$ is deposited on the $SiO_2$ layer 105 and heat treatment is applied thereto to turn the surface portion of the $SiO_2$ layer 105 into a phosphosilicate glass ($P_2O_5/SiO_2$)layer 106. Photoetching is then applied to bore openings through parts of the $SiO_2$ layer 105 to expose the N-type regions 101 to 104 and portions of the substrate surface as shown.

Figure 27:
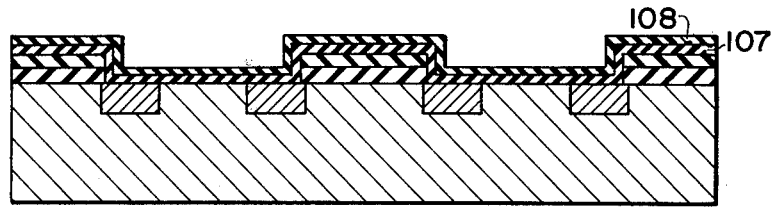
Figure 28:
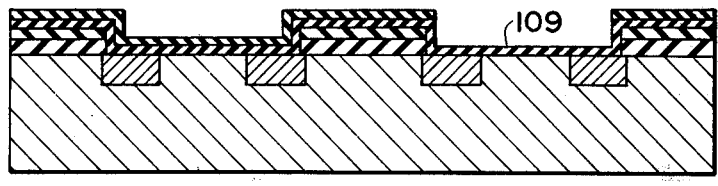

The silicon substrate 100 treated in this manner is then subject to thermal oxidization so that an $SiO_2$ layer 107 about 500 A thick is formed on the substrate surface, and then an $SiO_2$ layer 108 about 700 A thick is deposited on the $SiO_2$ layer 107 by the thermal decomposition of tetraethoxy silane as shown in FIG. 27. Subsequently, the $SiO_2$ layer 108 is partly removed as at 109 by the photo-etching as shown in FIG. 28, and the $SiO_2$ layer 108 and the exposed portion of the $SiO_2$ layer 107 are doped with $P_2O_5$ and are subjected to heat treatment so that the surface portion of the $SiO_2$ layers exposed to air is turned into a very thin layer of phosphosilicate glass (not shown since it is extremely thin).

Figure 29:
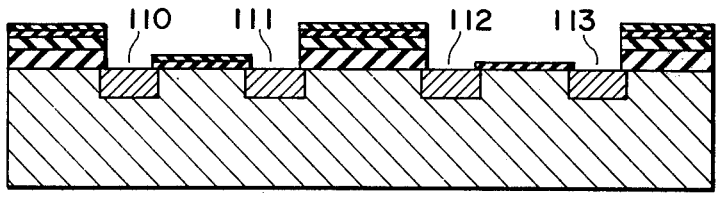
Figure 30:
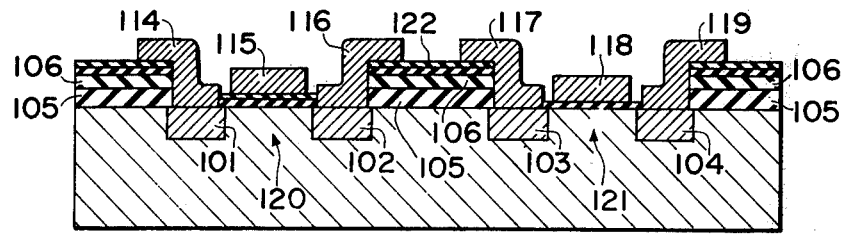

Photo-etching is then applied to bore openings 110 and 111 through the $SiO_2$ layers 107 and 108 and openings 112 and 113 through the silicon layer 107 thereby to expose the N-type regions 101, 102, 103 and 104 as shown in FIG. 29. A known method is used to deposit an electrode metal on the exposed surface portions and on the gate insulators as shown in FIG. 30. In FIG. 30 whish is an enlarged vertical sectional view of the device finally obtained, it will be seen that an enhancement-type N-channel MIS-FET 120 and a depletion-type N-channel MIS-FET 121 are formed on the surface of the P-type silicon substrate 100. The MIS-FET 120 includes a source electrode 114, a gate electrode 115 and a drain electrode 116, while the MIS-FET 121 includes a source electrode 117, a gate electrode 118 and a drain electrode 119.

A test was carried out for measuring the electrical properties of the device of such a structure. According to the test results, the MIS-FET 120 had a threshold voltage of $+1.5$ to $+2$ volts, the MIS-FET 121 had a threshold voltage of $-1.5$ to $-2$ volts, and the isolating portion 122 had a threshold voltage of $+10$ to $+15$ volts. The threshold voltage of the isolating portion 122 can be controlled by varying the thickness of the $SiO_2$ layer 105 deposited by the thermal decomposition of tetraethoxy silane.

While several preferred basic embodiments of the present invention have been described above for the purposes of illustration, it is apparent that the present invention is in no way limited to such specific embodiments and many changes and modifications may be made therein without departing from the scope of the appended claims.

We claim:

1. A semiconductor device comprising:
   a. a semiconductor substrate of p-conductivity type having at least one planar surface;
   b. a first n-channel insulated-gate field effect transistor disposed on the planar surface of said semiconductor substrate, and having spaced first source and first drain regions of n-conductivity type in the surface of said substrate, a first channel portion of said substrate intermediate said first source and first drain regions, a first gate insulator layer on said first channel portion and a first gate electrode on said first gate insulator layer, the first gate insulator layer being of a film which has a thickness less than 2000 A and is selected from the group consisting of an $SiO_2$ film and a composite film of an $SiO_2$ layer and a phosphosilicate glass layer, so that said first transistor is of depletion type; and
   c. a second n-channel insulated-gate field effect transistor disposed on the planar surface of said semiconductor substrate in spaced relation from said first transistor, said second transistor having spaced second source and second drain regions of n-conductivity type in the surface of said substrate, a second channel portion of said substrate intermediate said second source and second drain regions, a second gate insulator layer on said second channel portion and a second gate electrode on said second gate insulator layer, the second gate insulator layer including a first film which has a thickness less 2000 A and is selected from the group consisting of an $SiO_2$ film and a composite film of an $SiO_2$ layer and a phosphosilicate glass layer and a second film $Al_2O_3$ which has an effective oxide thickness one-half to five times that of said first film, said second gate insulator layer being capable of inducing holes in the second channel portion, so that said second transistor is of enhancement type;

wherein the improvement comprises
isolating film means disposed on a planar surface portion of said semiconductor substrate intermediate said first source and first drain regions of said first transistor and said second source and second drain regions of said second transistor for inducing holes in the surface portion of said substrate, the total effective oxide thickness of said isolating film means being more than two times that of the second gate insulator layer of said second transistor, thereby electrically isolating said first insulated-gate field effect transistor from said second insulated-gate field effect transistor, in which said isolating film means comprises a first film disposed on the surface portion of said substrate and selected from the group consisting of a film of $Al_2O_3$ and a film of silicon dioxide formed through thermal decomposition of tetraethoxy silane and a second film disposed on the first film and selected from the group consisting of a film of $SiO_2$ and a double-layer film consisting of a layer of $SiO_2$ and a layer of phosphosilicate glass.

2. A semiconductor device comprising:
   a. a semiconductor substrate of p-conductivity type having at least one planar surface;
   b. a first n-channel insulated-gate field effect transistor disposed on the planar surface of said semiconductor substrate, and having spaced first source and first drain regions of n-conductivity type in the surface of said substrate, a first channel portion of said substrate intermediate said first source and first drain regions, a first gate insulator layer on said first channel portion and a first gate electrode on said first gate insulator layer, the first gate insulator layer being of a film which has a thickness less than 2000 a and is selected from the group consisting of an $SiO_2$ film and a composite film of an $SiO_2$ layer and a phosphosilicate glass layer, so that said first transistor is of depletion type; and
   c. a second n-channel insulated-gate field effect transistor disposed on the planar surface of said semiconductor substrate in spaced relation from said first transistor, said second transistor having spaced second source and second drain regions of n-conductivity type in the surface of said substrate, a second channel portion of said substrate intermediate said second source and second drain regions, a second gate insulator layer on said second channel portion and a second gate electrode on said second gate insulator layer, the second gate insulator layer including a first film which has a thickness less 2000 A and is selected from the group consisting of an $SiO_2$ film and a composite film of an $SiO_2$ layer and a phosphosilicate glass layer and a second film $Al_2O_3$ which has an effective oxide thickness one-half to five times that of said first film, said second gate insulator layer being capable of inducing holes in the second channel portion, so that said second transistor is of enhancement type;

wherein the improvement comprises
isolating film means disposed on a planar surface portion of said semiconductor substrate intermediate said first source and first drain regions of said first transistor and said second source and second drain regions of said second transistor for inducing holes in the surface portion of said substrate, the total effective oxide thickness of said isolating film means being more than two times that of the second gate insulator layer of said second transistor, thereby electrically isolating said first insulated-gate field effect transistor from said second insulated-gate field effect transistor, in which said isolating film means is composed of a double-layer of $Al_2O_3$ and $SiO_2$, said layer of $Al_2O_3$ being directly disposed on the surface porton of said substrate, said layer of $SiO_2$ being disposed on the layer of $Al_2O_3$.

3. A semiconductor device having:

a semiconductor substrate of p-conductivity type having one planar surface, and a plurality of n-channel insulated-gate field effect transistors disposed on the planar surface of said substrate in spaced relation from each other, each of said transistors having spaced source and drain regions of n-conductivity type in the planar surface of said substrate, a channel portion of said substrate intermediate said source and drain regions, a gate insulator layer on said channel portion and a gate electrode on said insulator layer, the gate insulator layer of one of said transistors having a property capable of inducing holes in the channel portion thereof, so that said one transistor is of enhancement type, wherein the improvement comprises:

isolating film means disposed on an isolating surface portion of said substrate intermediate any two of said transistors for inducing holes in the isolating surface portion of said substrate thereunder, said isolating film means having an effective oxide thickness more than two times that of said gate insulator layer of said one transistor, to thereby electrically isolate any two of said transistors from each other, wherein said isolating film means comprises a layer of $Al_2O_3$ formed directly on said substrate and an $SiO_2$ layer formed thereon.

4. A semiconductor device according to claim 3 wherein said one transistor includes a first layer consisting of a material selected from $SiO_2$ and $SiO_2$ plus phosphosilicate glass and a second layer of $Al_2O_3$.

* * * * *